US012772433B2

(12) United States Patent
Kang et al.

(10) Patent No.: US 12,772,433 B2
(45) Date of Patent: Oct. 20, 2026

(54) SINGLE GATE THREE-DIMENSIONAL (3D) DYNAMIC RANDOM-ACCESS MEMORY (DRAM) DEVICES

(71) Applicant: Applied Materials, Inc., Santa Clara, CA (US)

(72) Inventors: Chang Seok Kang, San Jose, CA (US); Sung-Kwan Kang, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 476 days.

(21) Appl. No.: 18/236,922

(22) Filed: Aug. 22, 2023

(65) Prior Publication Data

US 2024/0098971 A1 Mar. 21, 2024

Related U.S. Application Data

(60) Provisional application No. 63/407,966, filed on Sep. 19, 2022.

(51) Int. Cl.
*H10B 12/00* (2023.01)

(52) U.S. Cl.
CPC ............. *H10B 12/30* (2023.02); *H10B 12/03* (2023.02); *H10B 12/05* (2023.02)

(58) Field of Classification Search
CPC ......... H10B 12/30; H10B 12/03; H10B 12/05
See application file for complete search history.

(56) References Cited

U.S. PATENT DOCUMENTS

2005/0001257 A1 1/2005 Schloesser et al.
2013/0099304 A1* 4/2013 Kim ....................... H10B 43/27 257/E21.423
2013/0234234 A1* 9/2013 Yoo ....................... H10D 30/693 438/270
2019/0355726 A1 11/2019 Pillarisetty et al.
2020/0350168 A1 11/2020 Kim et al.
2021/0183862 A1 6/2021 Son et al.
2021/0249415 A1 8/2021 Kang et al.
2022/0231035 A1 7/2022 Morris et al.

FOREIGN PATENT DOCUMENTS

| | | | |
|---|---|---|---|
| JP | 2012256821 | A | 12/2012 |
| JP | 2014131023 | A | 7/2014 |
| KR | 20220059424 | A | 5/2022 |
| KR | 20220125698 | A | 9/2022 |
| TW | 202139426 | A | 10/2021 |
| TW | 202230634 | A | 8/2022 |
| WO | 2022093460 | A1 | 5/2022 |

OTHER PUBLICATIONS

International Search Report and Written Opinion dated Dec. 7, 2023 for Application No. PCT/US2023/030842.
Korean Office Action dated Nov. 14, 2025 for Application No. 10-2025-7012281.
Office Action from Taiwanese Patent Application No. 112132057 dated Dec. 5, 2025.
Office Action from Japanese Patent Application No. 2025-515663 dated Apr. 21, 2026.

* cited by examiner

*Primary Examiner* — Errol V Fernandes
(74) *Attorney, Agent, or Firm* — Patterson + Sheridan, LLP

(57) ABSTRACT

A memory cell array includes a plurality of memory levels stacked in a first direction, each of the plurality of memory levels including an active region, a cell transistor having a single gate above the active region in the first direction, and a cell capacitor having a bottom electrode layer that is electrically connected to the active region.

20 Claims, 10 Drawing Sheets

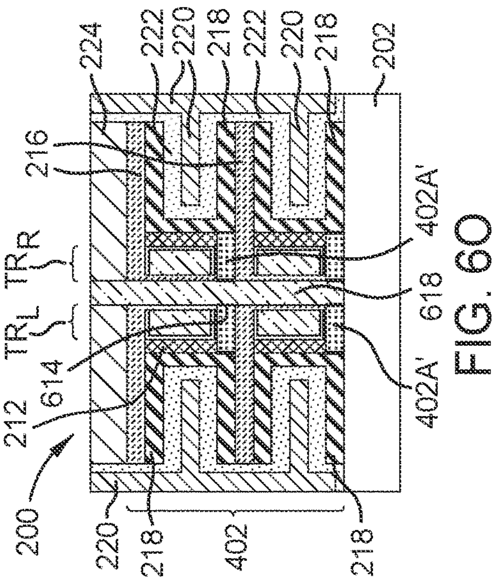
FIG. 6O
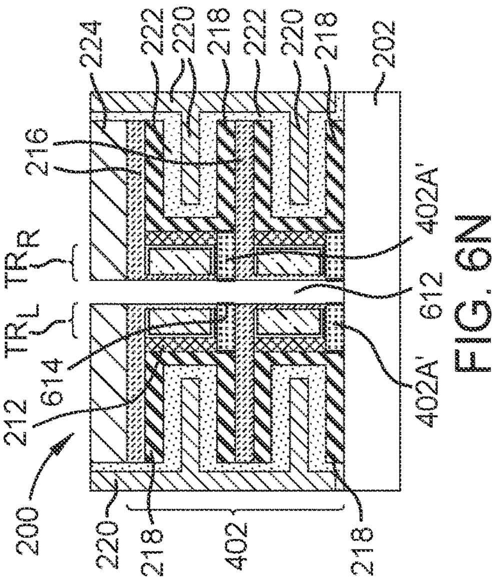
FIG. 6N
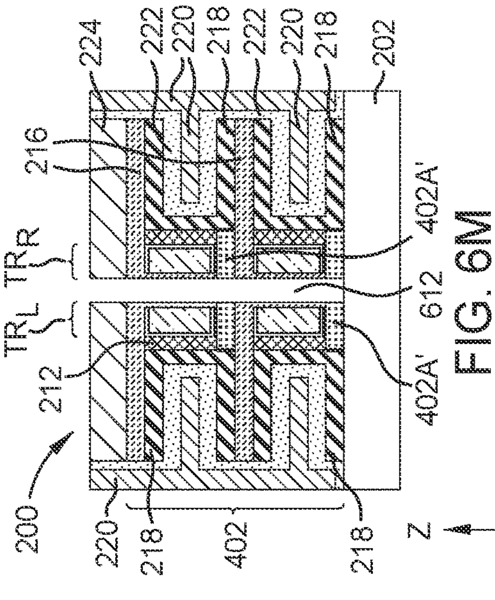
FIG. 6M
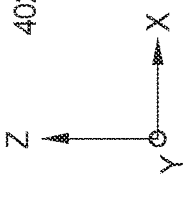

SINGLE GATE THREE-DIMENSIONAL (3D) DYNAMIC RANDOM-ACCESS MEMORY (DRAM) DEVICES

CROSS-REFERENCE TO RELATED APPLICATIONS

This application claims priority to U.S. Provisional Application Ser. No. 63/407,966 filed Sep. 19, 2022, which is herein incorporated by reference in its entirety.

BACKGROUND

Field

Embodiments described herein generally relate to semiconductor device fabrication, and more particularly, to single-gated three-dimensional dynamic random-access memory devices and methods of forming thereof.

Description of the Related Art

Three-dimensional (3D) dynamic random-access memory (DRAM) devices pose challenges in manufacturability due to their three-dimensional (3D) designs and small sizes. As the number of vertical stacks of memory cells in 3D DRAM devices (e.g., as chip densities increase), the height of each of the vertical stacks needs to be reduced. Typically, a 3D DRAM device includes individual memory cells, each of which includes a field-effect transistor (FET) having a double gated structure, in which two gates (and word lines connected to the two gates) are disposed on the sides of an active region along the direction of the vertical stacks. However, this structure poses a limitation in reducing a vertical height without increasing word line resistance or bit line capacitance.

Therefore, there is a need for 3D DRAM device structures in which the height of each of the vertical stacks of memory cells is reduced without increasing word line resistance or bit line capacitance and methods for fabrication such 3D DRAM device structures.

SUMMARY

Embodiments of the present disclosure provide a memory cell array. The memory cell array includes a plurality of memory levels stacked in a first direction, each of the plurality of memory levels including an active region, a cell transistor having a single gate above the active region in the first direction, and a cell capacitor having a bottom electrode layer that is electrically connected to the active region.

Embodiments of the present disclosure provide a method of forming cell transistors in a semiconductor memory device. The method includes depositing a stacking mold comprising a plurality of unit stacks, each unit stack comprising a thicker channel layer, a thicker sacrificial layer over the thicker channel layer, a thinner channel layer over the thicker sacrificial layer, and a thinner sacrificial layer over the thinner channel layer stacked in a first direction, forming a transistor slit through the stacking mold in the first direction, forming first recesses in the thicker sacrificial layers and second recesses in the thinner sacrificial layers from sidewalls of the transistor slit, partially filling the first recesses and fully filling with the second recesses with a first insulator layer from the sidewalls of the transistor slit, and removing the first insulator layer on the sidewalls of the transistor slit and within the first recesses.

Embodiments of the present disclosure provide a method of forming cell capacitors in a semiconductor memory device. The method includes depositing a stacking mold comprising a plurality of unit stacks, each unit stack comprising a thicker channel layer, a thicker sacrificial layer over the thicker channel layer, a thinner channel layer over the thicker sacrificial layer, and a thinner sacrificial layer over the thinner channel layer stacked in a first direction, forming a transistor slit through the stacking mold in the first direction, forming first openings in the thicker sacrificial layers and second openings in thinner sacrificial layers from sidewalls of the capacitor slits, partially filling the first openings and fully filling the second openings with a spacer layer from the sidewalls of the capacitor slits, and removing the spacer layer on the sidewalls of the capacitor slits and within the first openings.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of the scope of the disclosure, as the disclosure may admit to other equally effective embodiments.

FIGS. 6A, 6B, 6C, 6D, 6E, 6F, 6G, 6H, 6I, 6J, 6K, 6L, 6M, 6N, and 6O are cross-sectional views of a portion of a semiconductor structure corresponding to various states of the method of FIG. 5.

Figure 1B:
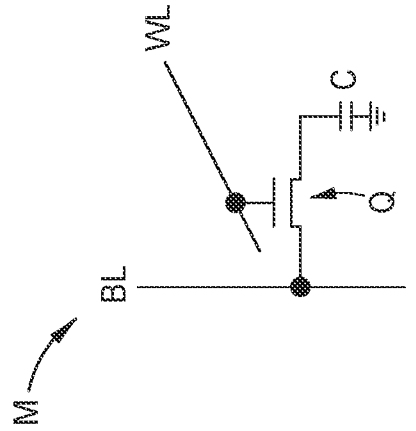
FIG. 1B is a schematic diagram of a DRAM cell.

To facilitate understanding, identical reference numerals have been used, where possible, to designate identical elements that are common to the figures. It is contemplated that elements and features of one embodiment may be beneficially incorporated in other embodiments without further recitation. In the figures and the following description, an orthogonal coordinate system including an X-axis, a Y-axis, and a Z-axis is used. The directions represented by the arrows in the drawings are assumed to be positive directions for convenience. It is contemplated that elements disclosed in some embodiments may be beneficially utilized on other implementations without specific recitation.

DETAILED DESCRIPTION

The embodiments described herein provide single gated three-dimensional (3D) dynamic random-access memory (DRAM) devices and methods for forming cell transistors and cell capacitors in single gated 3D DRAM devices. Due to the single gated structure, word lines that are connected to the gates can be shorter than in the double gated structure, and thus height of each of vertical stacks of memory cells can be scaled down without increasing a gate resistance or a bit line capacitance. Further, in the single gated 3D DRAM devices, active regions may be epitaxially grown, and thus may not be collapsed when the height of each of vertical stacks of memory cells is reduced. The embodiments described herein also provide methods of forming single gated 3D DRAM devices within two-color stacking mold of, for example, silicon (Si) and silicon germanium (SiGe).

Figure 1A:
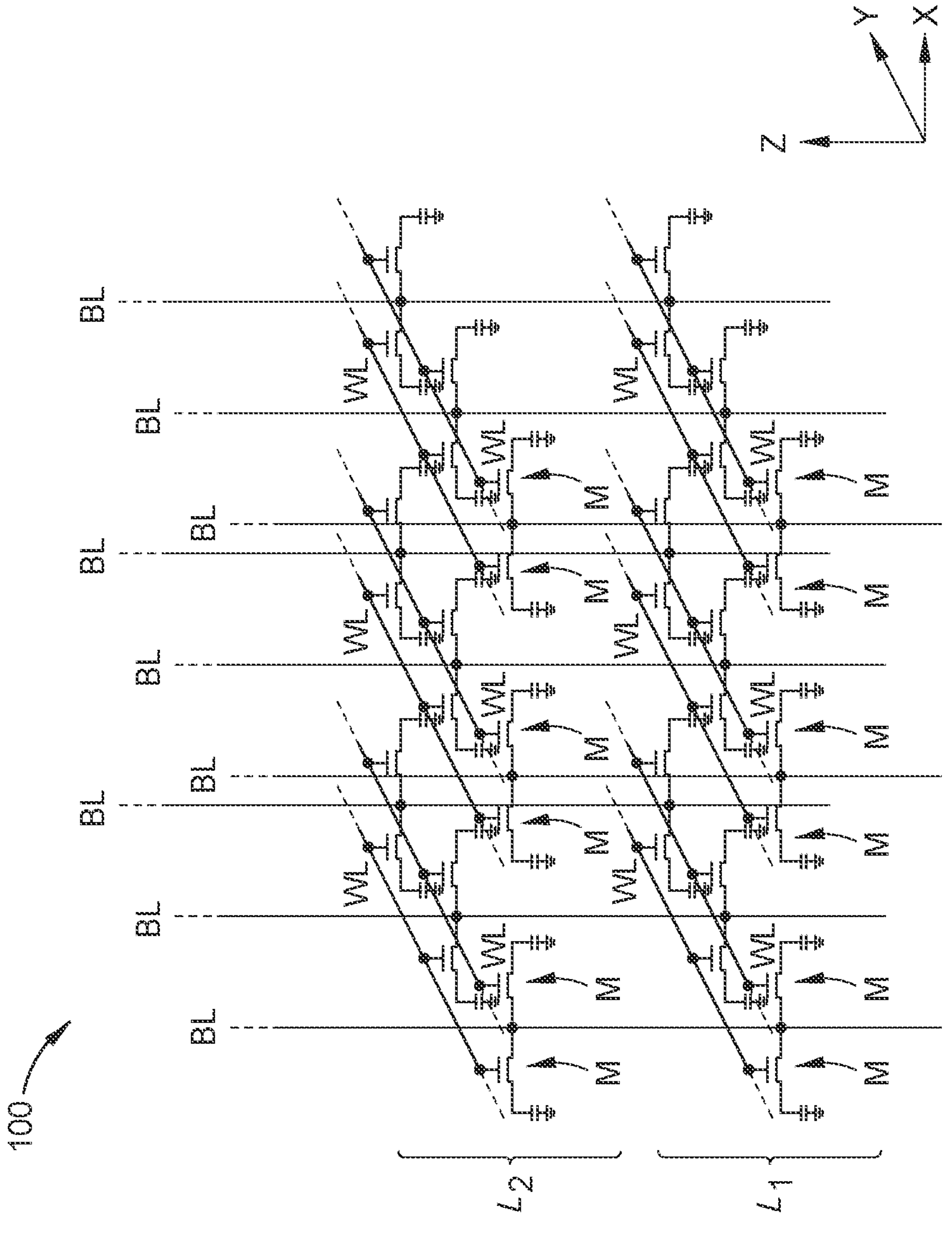
FIG. 1A is a schematic view of a portion of a three-dimensional (3D) memory cell array of dynamic random access memory (DRAM) cells according to one embodiment.

FIG. 1A is a schematic diagram of a portion of a three-dimensional (3D) memory cell array 100 of dynamic random access memory (DRAM) cells (also referred to as "memory cells") M, according to one or more embodiments of the present disclosure.

As shown in FIG. 1B, a single memory cell M includes an access transistor Q and a storage capacitor C. A memory cell M stores a datum bit by storing a packet of charge (i.e., a binary one) or no charge (i.e., a binary zero) on the storage capacitor C. A datum bit is input and output by a bit line BL that is connected to the source/drain of the access transistor Q, and input is controlled by a word line WL that is connected to the gate of the access transistor Q.

The memory cell array 100 includes memory levels $L_n$ (n=1, 2, . . . ) (a first memory level $L_1$ and a second memory level $L_2$ are shown) stacked in the Z direction. Each memory level $L_n$ includes two-dimensional (2-D) array of memory cells M. Although only two memory levels are shown in FIG. 1A, the memory cell array 100 may include more memory levels $L_n$ (n=3, 4, . . . ) stacked above the second memory level $L_2$ in the Z direction.

In the memory cell array 100, bit lines BL extend vertically in the Z direction, and word lines WL extend horizontally in the X-direction. Each of the bit lines BL is linked to the sources/drains of access transistors Q that are vertically aligned in the Z direction. Each of the word lines WL is linked to the gates of the access transistors that are horizontally aligned in the Y direction.

Figure 2A:
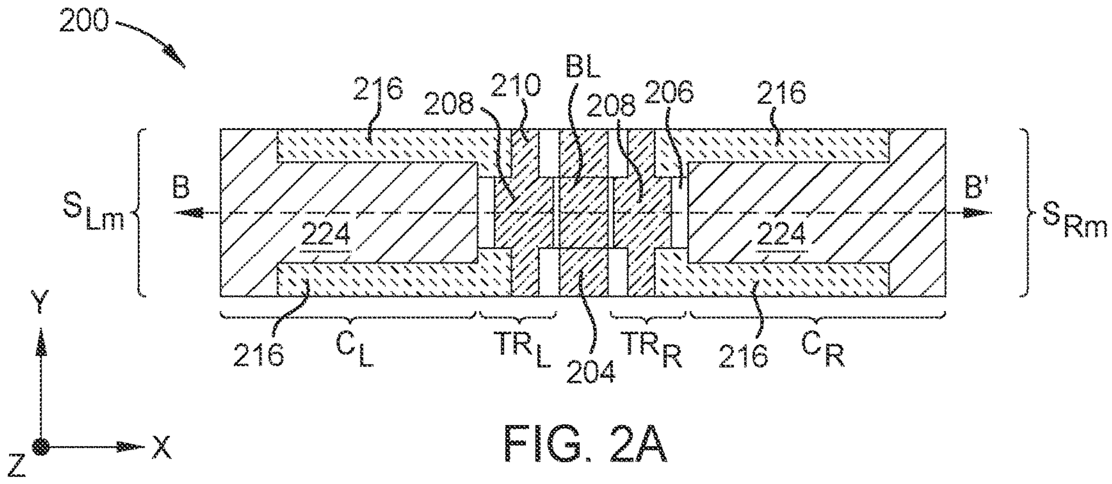
FIG. 2A is a top view of a portion of a semiconductor structure according to one embodiment.
Figure 2B:
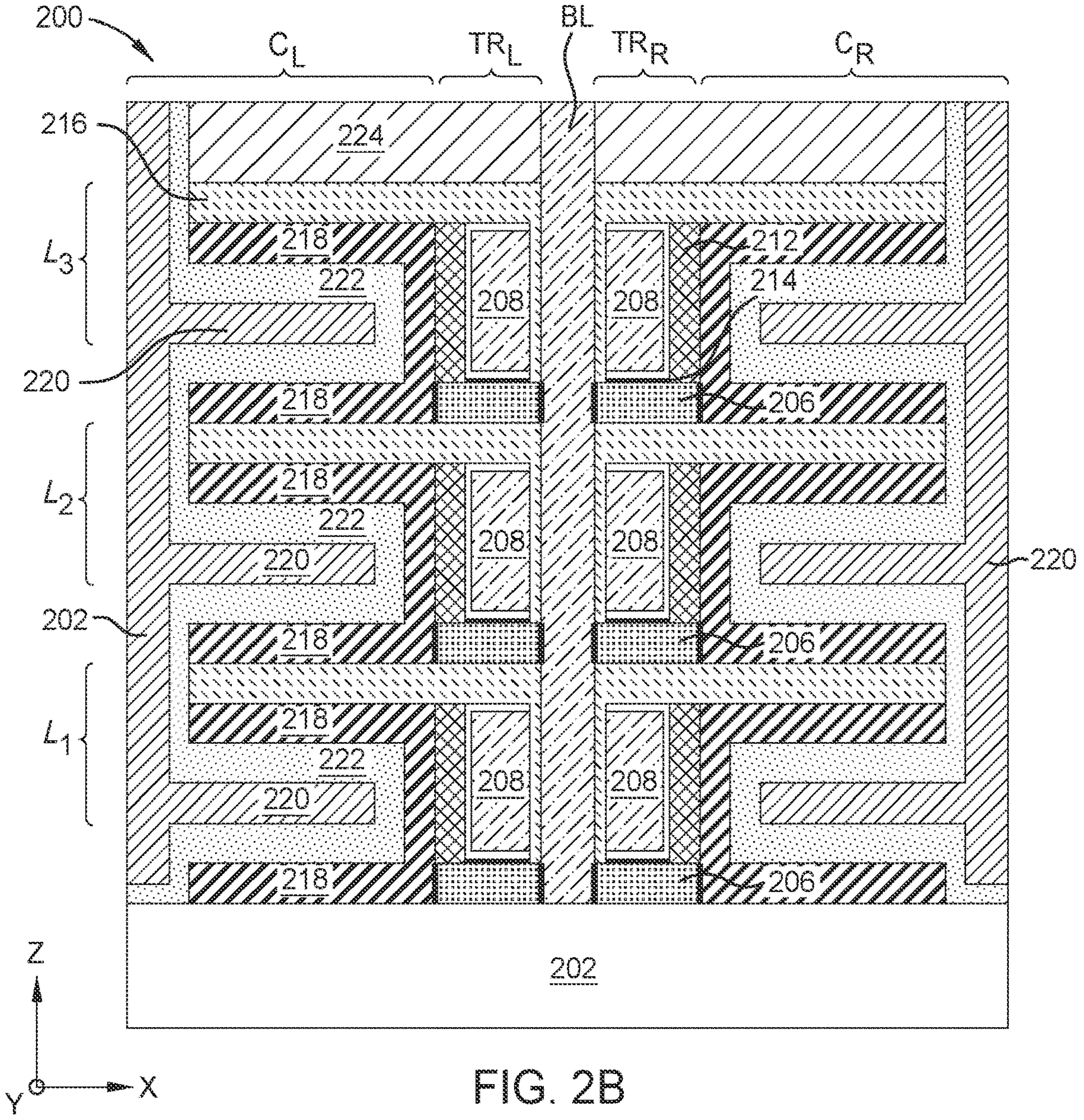
FIG. 2B is a cross-sectional view of a portion of the semiconductor structure along the line B-B' shown in FIG. 2A.

FIG. 2A is a top view of a portion of a semiconductor structure 200 that may form a 3D memory cell array, such as a portion of the memory cell array 100, according to one or more embodiments of the present disclosure. FIG. 2B is a cross-sectional view of a portion of the semiconductor structure 200 along the line B-B' shown in FIG. 2A. As shown, three memory levels $L_1$, $L_2$, and $L_3$ are stacked in the Z direction on a substrate 202. The semiconductor structure 200 may include more memory levels $L_n$ (n=4, 5, . . . ) (not shown) stacked above the third memory level L 3 in the Z direction.

The semiconductor structure 200 includes a left field effect transistor (FET) module $TR_L$, a right FET module $TR_R$ separated from the left FET module $TR_L$ in the X direction by a trench 204. The semiconductor structure 200 further includes a left capacitor module C L adjacent to the left FET module $TR_L$ in the X direction, and a right capacitor module C R adjacent to the right FET module $TR_R$ in the X direction. The left FET module $TR_L$ and the left capacitor module C L are divided into multiple sections $S_{Lm}$ (m=1, 2, 3, . . . ) in the Y direction (one $S_{Lm}$ shown in FIG. 2A). The right FET module $TR_R$ and the right capacitor module C R are divided into multiple sections $S_{Rm}$ (m=1, 2, 3, . . . ) in the Y direction (one $S_{Rm}$ is shown in FIG. 2A). The left FET module $TR_L$ and the left capacitor module C L in each memory level $L_n$ (n=1, 2, . . . ) in each section $S_{Lm}$ (m=1, 2, 3) form an access transistor Q and a storage capacitor C, respectively, which together form a memory cell M. Similarly, the right FET module $TR_R$ and the right capacitor module C R in each memory level $L_n$ (n=1, 2, . . . ) in each section $S_{Rm}$ (m=1, 2, 3) form an access transistor (also referred to as a "cell transistor") Q and a storage capacitor (also referred to as "cell capacitor") C, respectively, which together form a memory cell M. Although only one section $S_{Lm}$ and one section $S_{Rm}$ (m=1, 2, 3) are shown, more sections may be disposed along the Y direction.

The term "substrate" as used herein refers to a layer of material that serves as a basis for subsequent processing operations and includes a surface to be cleaned. The substrate 202 may be a silicon based material or any suitable insulating materials or conductive materials as needed. The substrate 202 may include a material such as crystalline silicon (e.g., Si<100> or Si<111>), silicon oxide, strained silicon, silicon germanium, doped or undoped polycrystalline silicon, doped or undoped silicon wafers and patterned or non-patterned wafers, silicon on insulator (SOI), carbon doped silicon oxides, silicon nitride, doped silicon, germanium, gallium arsenide, glass, or sapphire.

The FET modules $TR_L$ and $TR_R$ in the memory level $L_n$ (n=1, 2, 3, . . . ) (referred to as cell transistors $Q_{Ln}$ and $Q_{Rn}$) each include an active region 206, and a gate 208 above the active region 206 in the Z direction. In the single gated 3D DRAM structure described herein, each of the cell transistors $Q_{Ln}$ and $Q_{Rn}$ have a single gate 208 in contrast with the conventional double gated 3D DRAM structures. Word lines that are connected to gates in the single gated 3D structure can be shorter than in the double gated structure, and thus word line resistance can be reduced. Low word line resistance leads to fast operation speed due to the reduction in resistance-capacitance (RC) delay incurred by word lines. Lower bit line capacitance can lower the required cell capacitance which reduces capacitor area. The gate 208 is a portion of a word line layer 210 that extends in the Y direction. Cross sections of the active region 206 each act as a source/drain of the corresponding access transistor Q. An offset 212 is formed between the gate 208 and the source/drain. The active region 206 has a gate oxide layer 214 above the active region 206 in the Z direction. The FET modules $TR_L$ and $TR_R$ in the memory level $L_n$ (n=1, 2, 3, . . . ) (cell transistors $Q_{Ln}$ and $Q_{Rn}$) are separated from the FET modules $TR_L$ and $TR_R$ in adjacent memory level $L_{n+1}$ (cell transistors $Q_{Ln+1}$ and $Q_{Rn+1}$) by a spacer layer 216 disposed directly below and in contact with the active region 206 in the memory level $L_{n+1}$. The spacer layer 216 is also disposed to separate the active regions 206 between adjacent sections (e.g., $S_{Lm}$ and $S_{Lm\pm1}$, $S_{Rm}$ and $S_{Rm\pm1}$) within the memory level $L_n$ (n=1, 2, 3, . . . ). The active regions 206 may each have width in the Y direction of between about 20 nm and about 60 nm, for example, about 40 nm, and thickness in the Z direction of between about 10 nm and about 30 nm, for example, about 20 nm. A horizontal spacing between the adjacent active regions 206 in the Y direction may be between about 140 nm and about 180 nm, for example, about 160 nm, and a vertical spacing between the adjacent active regions 206 in the Z direction may be between about 50 nm and about 70 nm, for example, about 60 nm. The bit lines BL may have width in the Y direction of between about 40 nm and about 120 nm, for example, about 80 nm, and thickness in the X direction of between about 40 nm and about 120 nm, for example, about 80 nm. In some memory array designs, a bit line (BL) is common to the left FET module $TR_L$ and the right FET module $TR_R$, across the trench 204, and thus the width of the bit line BL in the X direction is the width of the trench 204. In these design, the word lines WL on the left FET module $TR_L$ and on the right FET module $TR_R$ may address two logical word line addresses and separately controlled. In some other memory array designs, two separate bit lines BL, one on the left FET module $TR_L$ and the other on the right FET module $TR_R$, are formed. These bit lines BL are isolated from each other and can be separately connected to different global bit lines.

The active regions 206 may be formed of silicon (Si) or indium gallium zinc oxide (IGZO). The active regions 206 may be epitaxially grown, and thus may not be collapsed when height of each of memory levels $L_n$ (n=1, 2, . . . ) is reduced. The word line layers 210 may be formed from tungsten (W), cobalt (Co), ruthenium (Ru), copper (Cu), molybdenum (Mo), titanium (Ti), nickel (Ni), silver (Ag), gold (Au), iridium (Ir), tantalum (Ta), or platinum (Pt), or conductive oxides or nitrides thereof, or any combination thereof. The offset 212 may be formed of silicon nitride ($Si_3N_4$). The gate oxide layers 214 may be formed of silicon oxide ($SiO_2$), silicon oxynitride (SiON), a high-K dielectric material, such as hafnium oxide ($HfO_2$), zirconium oxide ($ZrO_2$), vanadium oxide ($VO_2$), titanium oxide ($TiO_2$), aluminum oxide ($Al_2O_3$), hafnium silicon oxide (HfSiO), zirconium silicon oxide (ZrSiO), niobium oxide ($Nb_2O_5$), tantalum pentoxide ($Ta_2O_5$), or any combination thereof. The spacer layer 216 may be formed of dielectric material, such as silicon dioxide ($SiO_2$), silicon nitride ($Si_3N_4$), silicon oxynitride (SiON), silicon oxycarbide (SiOCN), boron-doped silicon oxycarbonitride (SiOCBN), or any combination thereof.

The semiconductor structure 200 further includes bit lines BL extending in the Z direction within the trench 204 between adjacent sections $S_{Lm}$ (m=1, 2, 3, . . . ) and $S_{Rm}$ (m=1, 2, 3, . . . ) (e.g., between the sections $S_{Lm}$ and $S_{Rm}$, as shown in FIG. 2A). The bit line BL between the sections $S_{Lm}$ and $S_{Rm}$ (m=1, 2, 3, . . . ) is electrically connected to the active regions 206 in the left FET module $TR_L$ in the section $S_{Lm}$ in all memory levels $L_n$ (n=1, 2, 3, . . . ). The bit line BL between the sections $S_{Lm}$ and $S_{Rm}$ (m=1, 2, 3, . . . ) is further electrically connected to the active regions 206 in the right FET module $TR_R$ in the section $S_{Rm}$ in all memory levels $L_n$ (n=1, 2, 3, . . . ).

The bit lines BL may be formed of metal such as tungsten (W), molybdenum (Mo), titanium (Ti), cobalt (Co), nickel (Ni), tantalum (Ta), or any combination thereof.

The left capacitor module C L and the right capacitor module CR in the memory level $L_n$ (n=1, 2, 3, . . . ) each includes a bottom electrode layer 218 that is electrically connected to the active region 206 within the memory level $L_n$, a top electrode layer 220 that is grounded (not shown), and a high-k dielectric layer 222 between the bottom electrode layer 218 and the top electrode layer 220. The bottom electrode layer 218 and the top electrode layer 220 may serve as two plates of a capacitor C. The bottom electrode layer 218 and the top electrode layer 220 may be formed of titanium nitride (TiN), cobalt (Co), tungsten (W), aluminum (Al), ruthenium (Ru), iridium (Ir), molybdenum (Mo), platinum (Pt), tantalum (Ta), titanium (Ti), rhodium (Rh), or conductive metal nitrides, or any combination thereof. The high-k dielectric layer 222 may be formed of a high-k dielectric material such as, hafnium oxide ($HfO_2$), zirconium oxide ($ZrO_2$), aluminum oxide ($Al_2O_3$), vanadium oxide ($VO_2$), titanium oxide ($TiO_2$), tin oxide ($SnO_2$), zinc oxide (ZnO), hafnium silicon oxide (HfSiO), zirconium silicon oxide (ZrSiO), niobium oxide ($Nb_2O_5$), tantalum pentoxide ($Ta_2O_5$), or any combination thereof.

The semiconductor structure 200 further includes an insulator layer 224 over the topmost spacer layer 216. The insulator layer 224 may be formed of silicon oxide ($SiO_2$) and my act as an etch stopping layer during a patterning process.

Figure 3:
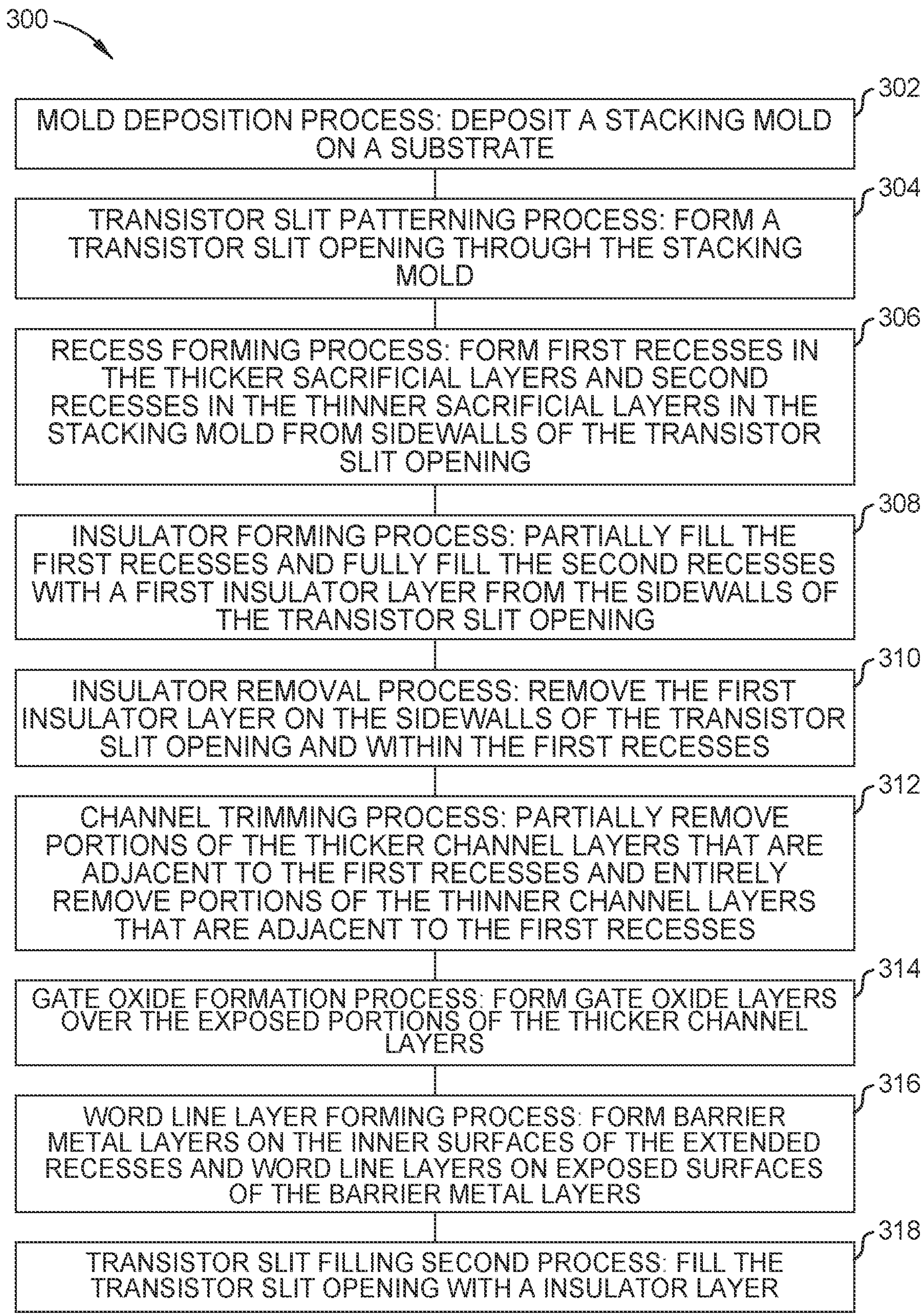
FIG. 3 depicts a process flow diagram of a method of forming cell transistors in a semiconductor structure according to one embodiment.

FIG. 3 depicts a process flow diagram of a method 300 of forming cell transistors in a semiconductor structure 200. FIGS. 4A, 4B, 4C, 4D, 4E, 4F, 4G, 4H, and 4I are cross-sectional views of a portion of the semiconductor structure 200 corresponding to various states of the method 300. It should be understood that FIGS. 4A, 4B, 4C, 4D, 4E, 4F, 4G, 4H, and 4I illustrate only partial schematic views of the semiconductor structure 200, and the semiconductor structure 200 may contain any number of transistor sections and additional materials having aspects as illustrated in the figures. It should also be noted that although the method illustrated in FIG. 3 is described sequentially, other process sequences that include one or more operations that have been omitted and/or added, and/or has been rearranged in another desirable order, fall within the scope of the embodiments of the disclosure provided herein.

Figure 4A:
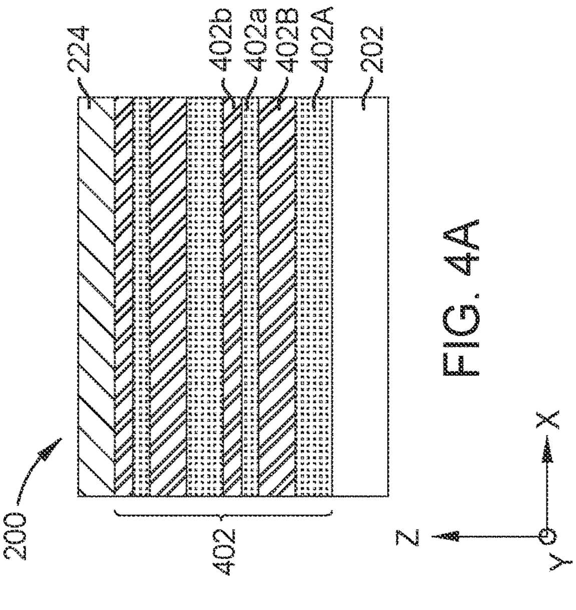
FIGS. 4A, 4B, 4C, 4D, 4E, 4F, 4G, 4H, and 4I are cross-sectional views of a portion of a semiconductor structure corresponding to various states of the method of FIG. 3.

The method 300 begins with block 302, in which a mold deposition process is performed to deposit a stacking mold 402 on a substrate 202, and an insulator layer 224 on the stacking mold 402, as shown in FIG. 4A. The insulator layer 224 may be formed of silicon oxide ($SiO_2$) and my act as an etch stopping layer during patterning of the stacking mold 402. The stacking mold 402 includes multiple unit stacks of a thicker channel layer 402A, a thicker sacrificial layer 402B over the thicker channel layer 402A, a thinner channel layer 402*a* over the thicker sacrificial layer 402B, and a thinner sacrificial layer 402*b* over the thinner channel layer 402*a* stacked in the Z direction. The thicker channel layers 402A and the thinner channel layers 402*a* may be formed of first material. The thicker sacrificial layers 402B and the thinner sacrificial layers 402*b* may be formed of second material. The etch selectivity of the second material (i.e., a ratio of the etch rate of the second material to the etch rate of the first material) is between about 10:1 to 500:1. Examples of the first material include pure silicon (Si) and indium gallium zinc oxide (IGZO). Examples of the second material include silicon germanium (SiGe) having germanium (Ge) concentration of between about 1% and about 50%), silicon oxide ($SiO_2$), borophosphosilicate glass (BPSG), boron silica glass (BSG), and phosphosilicate glass (PSG). The thicker channel layers 402A each have a thickness $t_A$ that is greater than a thickness $t_a$ of each of the thinner channel layers 402*a* by a factor of between about 1.1 and about 2, for example, 2. The thicker sacrificial layers 402B each have a thickness $t_B$ that is greater than a thickness $t_b$ of each of the thinner sacrificial layers 402*b* by a factor of between about 1.1 and about 2, for example, 2. Thickness $t_A$ of the thicker channel layer 402A and thickness $t_B$ of thicker sacrificial layer 402B may be between about 10 nm and about 40 nm, for example, about 20 nm. Thickness $t_a$ of the thinner channel layer 402*b* and thickness $t_b$ of the thinner sacrificial layer 402*b* may be between about 5 nm and about 20 nm, for example, about 10 nm.

In the example shown in FIG. 4A, the number of unit stacks of the thicker channel layer 402A, the thicker sacrificial layer 402B, and the thinner channel layer 402*a*, and the thinner sacrificial layer 402*b* is two. However, the number of unit stacks may be larger than 100, for example, about 200.

The mold deposition process in block 302 may include any appropriate deposition process, such as chemical vapor deposition (CVD), epitaxial deposition process, or the like.

Figure 4B:
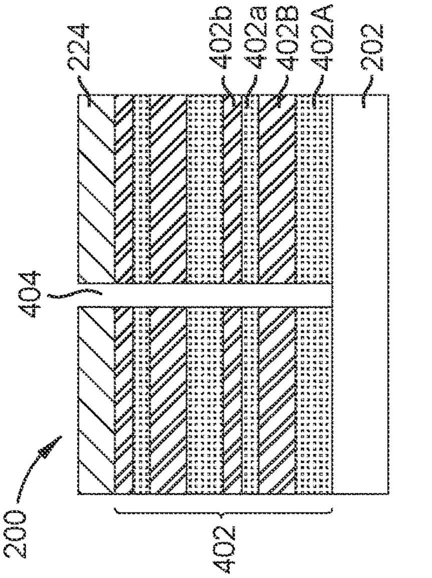

In block 304, a transistor slit patterning process is performed to form a transistor slit 404 through the stacking mold 402 and the insulator layer 224 in the Z direction, as shown in FIG. 4B. The transistor slit 404 may have a width in the X direction of between about 50 nm and about 200 nm, for example, about 100 nm and a depth in the Y direction of between about 50 nm and about 200 nm.

The transistor slit patterning process in block 304 may include any appropriate lithography and etch processes, such as photolithography.

Figure 4C:
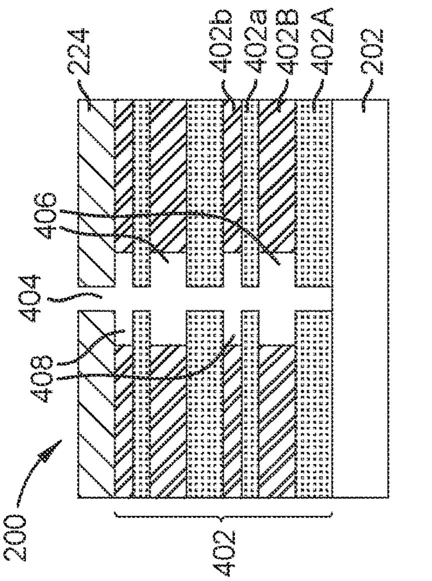

In block 306, a recess forming process is performed to form recesses 406 in the thicker sacrificial layers 402B and recesses 408 in the thinner sacrificial layers 402*b* in the stacking mold 402 from sidewalls of the transistor slit 404, as shown in FIG. 4C. The recesses 406 each have a height corresponding to the thickness $t_B$ of the thicker sacrificial layer 4026. The recesses 408 each have a height corresponding to the thickness $t_b$ of the thinner sacrificial layer 402*b*. The recesses 406 and 408 may have a width of between 50 nm and about 300 nm, for example, about 150 nm.

The recess forming process in block 306 may include a wet etch process using hydrofluoric acid (HF)-hydrogen peroxide ($H_2O_2$)-based mixtures, for example, a mixture of hydrofluoric acid (HF), hydrogen peroxide ($H_2O_2$), and acetic acid ($CH_3COOH$), in a volume ratio of 1:2:3.

Figure 4D:
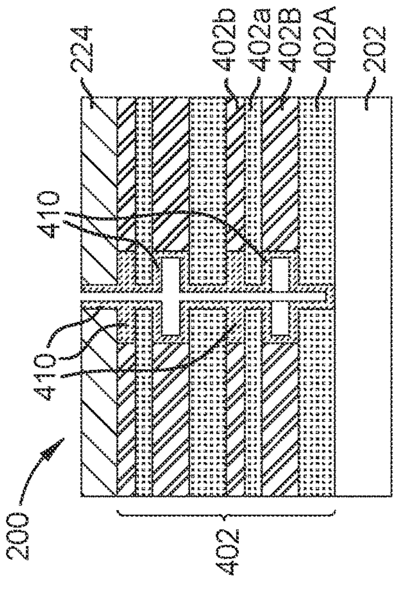

In block 308, an insulator forming process is performed to partially fill the recesses 408 and fully fill the recesses 408 with an insulator layer 410 from sidewalls of the transistor slit 404, as shown in FIG. 4D. The insulator layer 410 is conformally deposited on exposed surfaces within the transistor slit 404. The insulator layer 410 may be formed of silicon oxide ($SiO_2$) and have a thickness of between about a half of $t_b$ (height of each of the recesses 408, e.g., about 10 nm) and about a half of $t_B$ (thickness of each of the recesses 406, e.g., about 20 nm). Thus, the recesses 406 are partially filled with the insulator layer 410 and the recesses 408 are fully filled with the insulator layer 410.

The insulator forming process in block 308 may include any appropriate deposition process, such as atomic layer deposition (ALD).

Figure 4E:
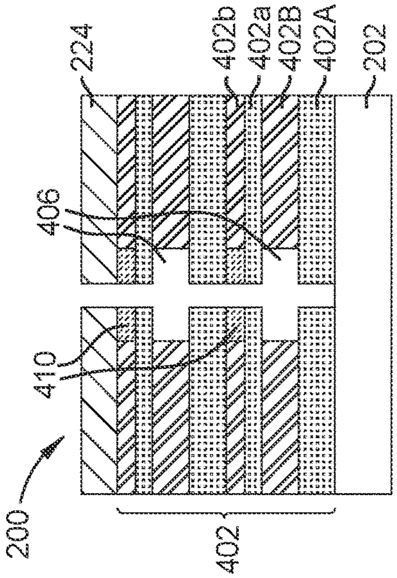

In block 310, an insulator removal process is performed to remove the insulator layer 410 on the sidewalls of the transistor slit 404 and within the recesses 406, as shown in FIG. 4E. The insulator layers 410 in the recesses 408 remain.

The insulator removal process in block 310 may include an etch process using hydrofluoric acid (HF) solution.

Figure 4F:
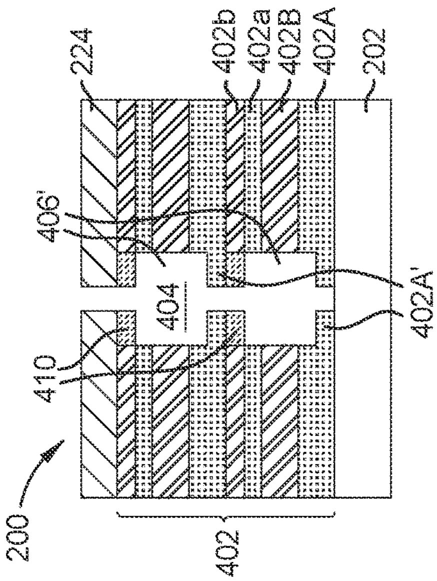

In block 312, a channel trimming process is performed to partially remove portions of the thicker channel layers 402A that are adjacent to the recesses 406 in the Z direction and entirely remove portions of the thinner channel layers 402*a* that are adjacent to the recesses 406 in the Z direction, as shown in FIG. 4F. The portions of the thicker channel layers 402A and the thinner channel layers 402*a* are trimmed from the recesses 406 by the same thickness as the thickness $t_a$ of the thinner channel layer 402*a* (e.g., about 10 nm). Thus, exposed portions 402A' of the thicker channel layers 402A each have a thickness of the thickness $t_a$ of the thinner channel layer 402*a* subtracted from the thickness $t_A$ of the thicker channel layer 402A ($t_A-t_a$, e.g., between about 5 nm and about 20 nm, for example, about 10 nm), and the extended recesses 406' each have a height of a sum of the thickness $t_B$ of thicker sacrificial layer 402B and twice of the thickness $t_a$ of the thinner channel layer 402*b* ($t_B+2t_a$, e.g., between about 20 nm and about 60 nm, for example, about 40 nm).

The channel trimming process in block 312 may include a wet etch process using tetramethyl ammonium hydroxide (TMAH, $(CH_3)_4NOH$) with high etch selectivity against silicon oxide ($SiO_2$), or a dry etch process such as reactive ion etching (RIE).

Figure 4I:
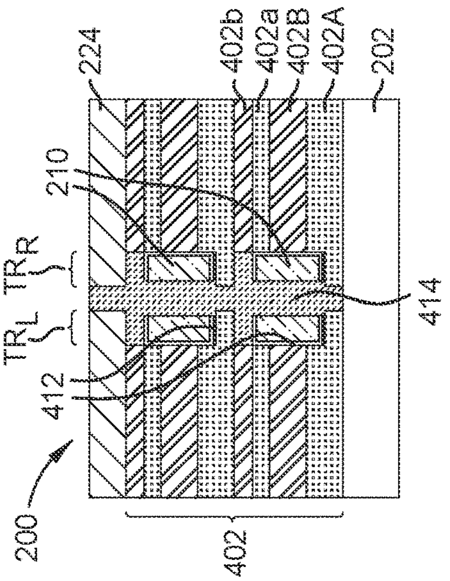
Figure 4H:
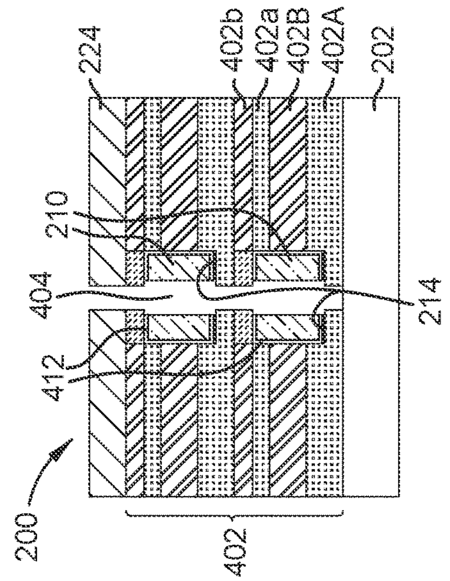
Figure 4G:
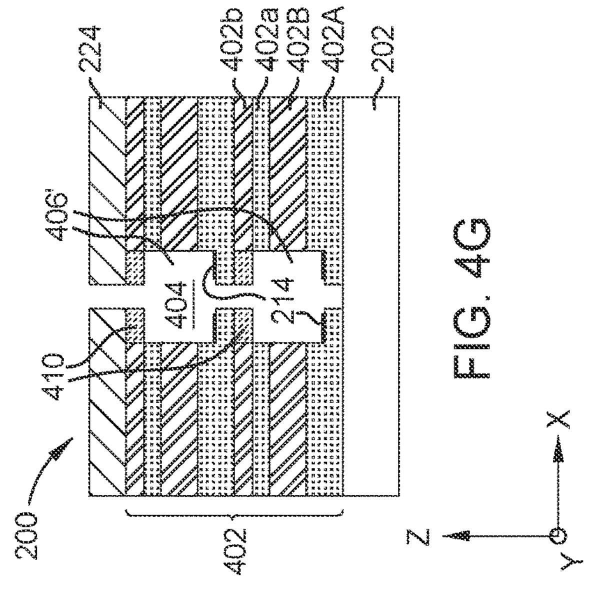

In block 314, a gate oxide formation process is performed to form gate oxide layers 214 over the exposed portions 402A' of the thicker channel layers 402A, as shown in FIG. 4G. The gate oxide layers 214 may have a thickness of between about 1 nm and about 5 nm.

The gate oxide formation process in block 314 may include a suitable thermal oxidation process to oxide surfaces of the exposed portions 402A' of the thicker channel layers 402A, such as an enhanced in-situ steam generation (eISSG) process utilizing nitrous oxide ($N_2O$) gas, an in-situ steam generation (ISSG) process utilizing $H_2$ and $O_2$ gases, or a rapid thermal oxidation (RTO) process utilizing $NH_3$ and $O_2$ gases.

In block 316, a word line layer forming process is performed to form barrier metal layers 412 on the inner surfaces of the extended recesses 406' and word line layers 210 on exposed surfaces of the barrier metal layers 412, as shown in FIG. 4H. The barrier metal layers 412 and the word line layers 210 are then recessed from the transistor slit 404. This node separation process ensures isolation of vertically adjacent access transistors Q. The word line layers 210 may be formed of contact plug metal material, such as tungsten (W), cobalt (Co), ruthenium (Ru), or molybdenum (Mo). The barrier metal layer 412 may be formed of a barrier metal material that is titanium nitride (TiN), or tantalum nitride (TaN).

The word line layer forming process in block 316 may include any appropriate deposition process, such as atomic layer deposition (ALD), chemical vapor deposition (CVD), physical vapor deposition (PVD), or the like.

In block 318, a transistor slit filling process is performed to fill the transistor slit 404 with an insulator layer 414, as shown in FIG. 4I. The insulator layer 414 may be formed of silicon oxide ($SiO_2$.) As shown, a left FET module $TR_L$ and a right FET module $TR_R$ are formed.

The transistor slit filling process in block 318 may include any appropriate deposition process, such as atomic layer deposition (ALD).

Figure 5A:
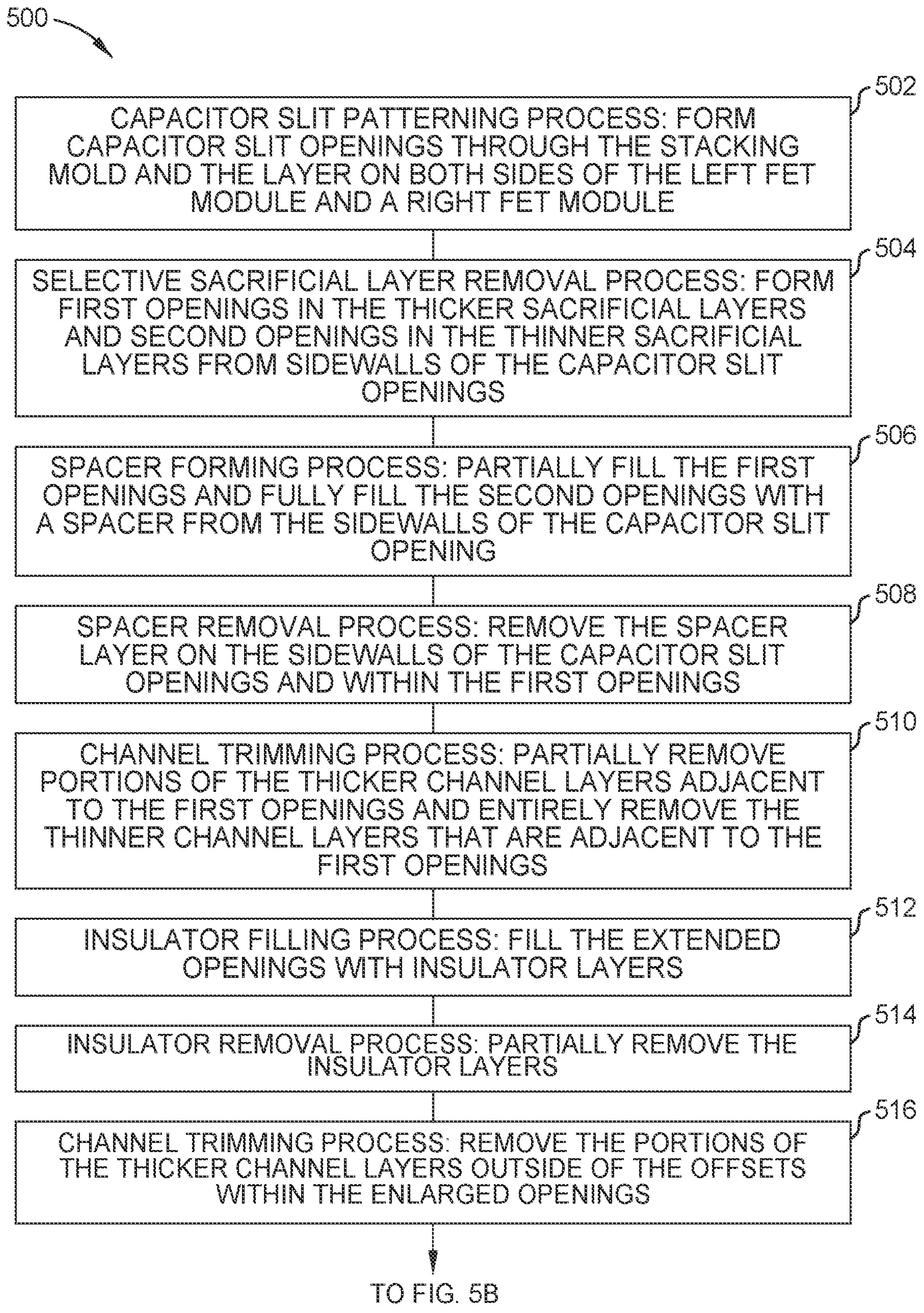
FIGS. 5A and 5B depict a process flow diagram of a method 500 for forming cell capacitors in a semiconductor structure formed by the method of FIG. 3.
Figure 5B:
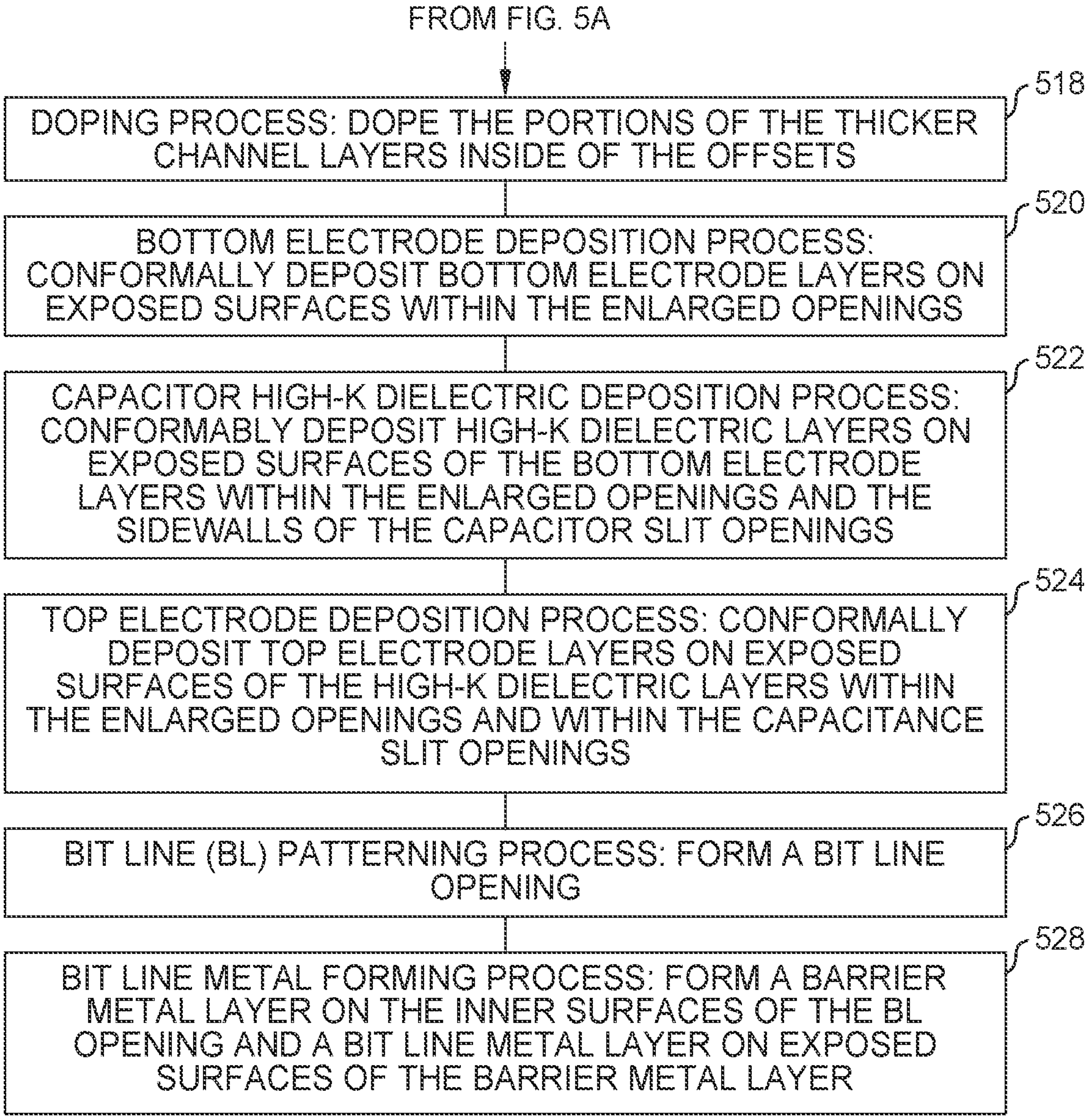

FIGS. 5A and 5B depict a process flow diagram of a method 500 for forming cell capacitors in the semiconductor structure 200 formed by the method 300. FIGS. 6A, 6B, 6C, 6D, 6E, 6F, 6G, 6H, 6I, 6J, 6K, 6L, 6M, 6N, and 6O are cross-sectional views of a portion of the semiconductor structure 200 corresponding to various states of the method 500. It should be understood that FIGS. 6A, 6B, 6C, 6D, 6E, 6F, 6G, 6H, 6I, 6J, 6K, 6L, 6M, 6N, and 6O illustrate only partial schematic views of the semiconductor structure 200, and the semiconductor structure 200 may contain any number of transistor sections and additional materials having aspects as illustrated in the figures. It should also be noted that although the method illustrated in FIGS. 5A and 5B is described sequentially, other process sequences that include one or more operations that have been omitted and/or added, and/or has been rearranged in another desirable order, fall within the scope of the embodiments of the disclosure provided herein.

Figures 6A, 6B, 6C, 6D, 6E, 6F:
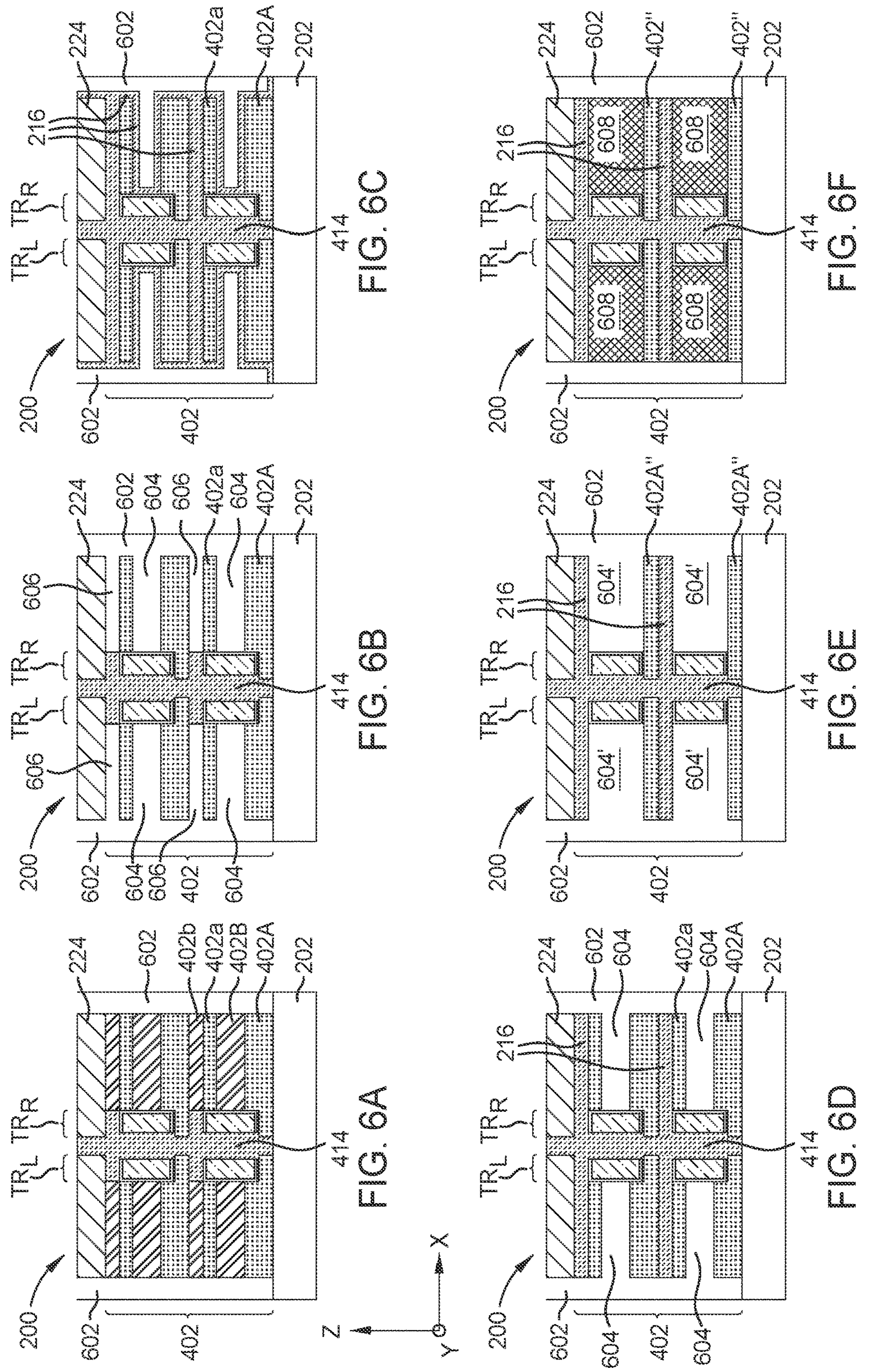

The method 500 begins with block 502, in which a capacitor slit patterning process is performed to form capacitor slits 602 through the stacking mold 402 and the insulator layer 224 on both sides of a left FET module $TR_L$ and a right FET module $TR_R$, as shown in FIG. 6A. The capacitor slits 602 may each have a width of between about 80 nm and about 200 nm.

The capacitor slit patterning process in block 502 may include any appropriate lithography and etch processes, such as photolithography.

In block 504, a selective sacrificial layer removal process is performed to form openings 604 in the thicker sacrificial layers 402B and openings 606 in the thinner sacrificial layers 402*b* from sidewalls of the capacitor slits 602, as shown in FIG. 6B. The openings 604 are formed where the thicker sacrificial layers 402B are removed and each have a height corresponding to the thickness $t_B$ of the thicker sacrificial layer 402B. The openings 606 are formed where the thinner sacrificial layers 402*b* are removed and each have a height corresponding to the thickness $t_b$ of the thinner sacrificial layer 402*b*.

The selective sacrificial layer removal process in block 504 may include a wet etch process using hydrofluoric acid (HF)-hydrogen peroxide ($H_2O_2$)-based mixtures, for example, a mixture of hydrofluoric acid (HF), hydrogen peroxide ($H_2O_2$), and acetic acid ($CH_3COOH$), in a volume ratio of 1:2:3.

In block 506, a spacer forming process is performed to partially fill the openings 604 and fully fill the openings 606 with a spacer layer 216 from the sidewalls of the capacitor slits 602, as shown in FIG. 6C. The spacer layer 216 is conformally deposited on exposed surfaces within the capacitor slits 602, as shown in FIG. 6C. The spacer layer 216 may be formed of silicon oxide ($SiO_2$) and have a thickness of between about a half of $t_b$ (height of each of the openings 606, e.g., about 10 nm) and about a half of $t_B$ (height of each of the openings 604, e.g., about 20 nm). Thus, the openings 604 are partially filled with the spacer layer 216 and the openings 606 are fully filled with the spacer layer 216. The spacer layer 216 in the openings 606 merges with the insulator layer 410 formed in the transistor slit 404.

The spacer forming process in block 506 may include any appropriate deposition process, such as atomic layer deposition (ALD).

In block 508, a spacer removal process is performed to remove the spacer layer 216 on the sidewalls of the capacitor slits 602 and within the openings 604, as shown in FIG. 6D. The spacer layers 216 in the openings 606 remain.

The spacer removal process in block 508 may include an etch process using hydrofluoric acid (HF) solution.

In block 510, a channel trimming process is performed to partially remove portions of the thicker channel layers 402A that are adjacent to the openings 604 in the Z direction and entirely removing portions of the thinner channel layers 402*a* that are adjacent to the openings 604 in the Z direction from the openings 604, as shown in FIG. 6E. The portions of the thicker channel layers 402A and the thinner channel layers 402*a* are trimmed from the openings 604 by the same thickness as the thickness $t_a$ of the thinner channel layer 402*a* (e.g., about 10 nm). Thus, the thinner channel layers 402*a* are entirely removed, and the thicker channel layers 402A are partially removed. The remaining portions 402A" of the thicker channel layers 402A each have a thickness of the thickness $t_a$ of the thinner channel layer 402*a* subtracted from the thickness $t_A$ of the thicker channel layer 402A ($t_A-t_a$, e.g., between about 5 nm and about 20 nm, for example, about 10 nm), and the extended openings 604' each have a height of a sum of the thickness $t_B$ of thicker sacrificial layer 402B and twice of the thickness $t_a$ of the thinner channel layer 402*b* ($t_B+2t_a$, e.g., between about 20 nm and about 60 nm, for example, about 40 nm).

The channel trimming process in block 510 may include a wet etch process using tetramethyl ammonium hydroxide (TMAH, $(CH_3)_4NOH$) with high etch selectivity against silicon oxide ($SiO_2$), or a dry etch process such as reactive ion etching (RIE).

In block 512, an insulator filling process is performed to fill the extended openings 604' with insulator layers 608, as shown in FIG. 6F. The insulator layers 608 may be formed of silicon nitride ($Si_3N_4$).

The insulator filling process in block 512 may include any appropriate deposition process, such as atomic layer deposition (ALD), chemical vapor deposition (CVD), physical vapor deposition (PVD), or the like.

Figure 6G:
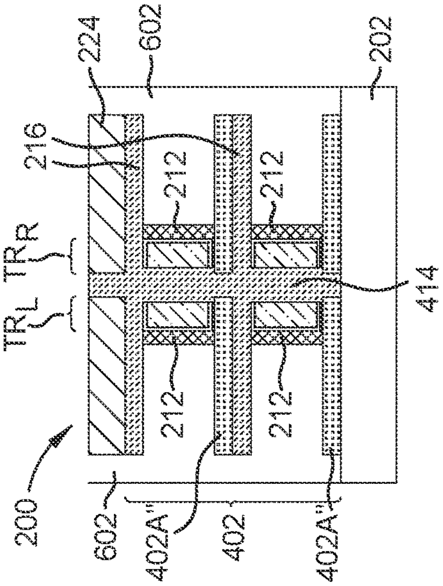

In block 514, an insulator removal process is performed to partially remove the insulator layers 608, as shown in FIG. 6G. The remaining insulator layers 212 on sidewalls of the word line layers 210 (i.e., inner surfaces of the enlarged openings 604" opposite of the capacitor slits 602 in the X direction) and may each have a thickness of between about 5 nm and about 50 nm. The remaining insulator layers 212 on inner surfaces of the enlarged openings 604" act as offsets between the word line layers 210 and source/drain (S/D) to be formed.

The insulator removal process in block 514 may include a dry etch process such as reactive ion etching (RIE).

Figure 6H:
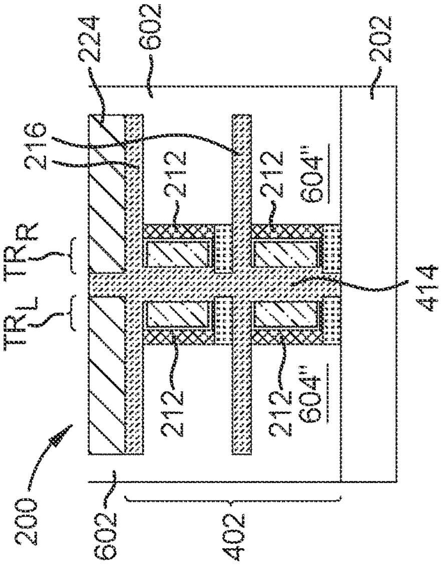

In block 516, a channel trimming process is performed to remove the remaining portions 402A" of the thicker channel layers 402A outside of the offsets 212 within the enlarged to openings 604", as shown in FIG. 6H. The portions 402A" of the thicker channel layers 402A that are removed each have a thickness of the thickness $t_a$ of the thinner channel layer 402*a* subtracted from the thickness $t_A$ of the thicker channel layer 402A ($t_A-t_a$, for example, about 10 nm). The portions 402A' of the thicker channel layers 402A adjacent to the word line layers 210 in the Z direction remain. As a result, the extended openings 604' are further enlarged to openings 604" such that areas of cell capacitors to be formed can be enlarged.

The channel trimming process in block 516 may include a wet etch process using tetramethyl ammonium hydroxide (TMAH, $(CH_3)_4NOH$), or a dry etch process such as reactive ion etching (RIE).

Figure 6I:
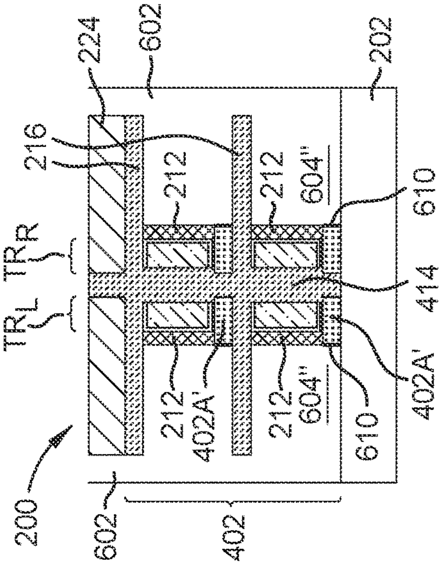

In block 518, a doping process is performed to dope the portions 402A' of the thicker channel layers 402A inside of the offsets 212 with n-type dopants, such as such as phosphorous (P) or arsenide (As) from sides 610 adjacent to the enlarged openings 604", as shown in FIG. 6I.

The doping process in block 518 may include gas phase doping.

Figure 6J:
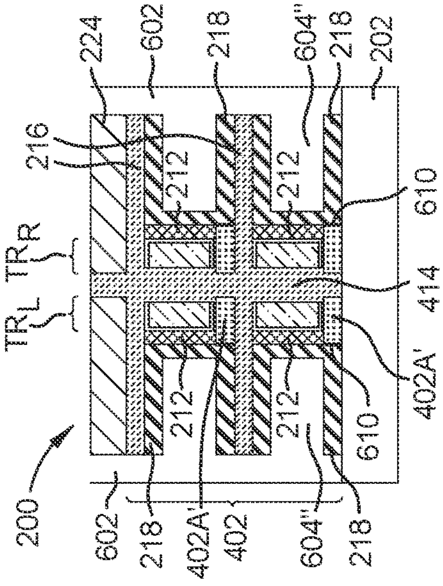

In block 520, a bottom electrode deposition process is performed to conformally deposit bottom electrode layers 218 on exposed surfaces within the enlarged openings 604", as shown in FIG. 6J. The bottom electrode layers 218 may be formed of titanium nitride (TiN) and have a thickness of between about 1 nm and 10 nm.

The bottom electrode deposition process in block 520 may include any appropriate deposition process, such as atomic layer deposition (ALD), chemical vapor deposition (CVD), physical vapor deposition (PVD), or the like.

Figure 6K:
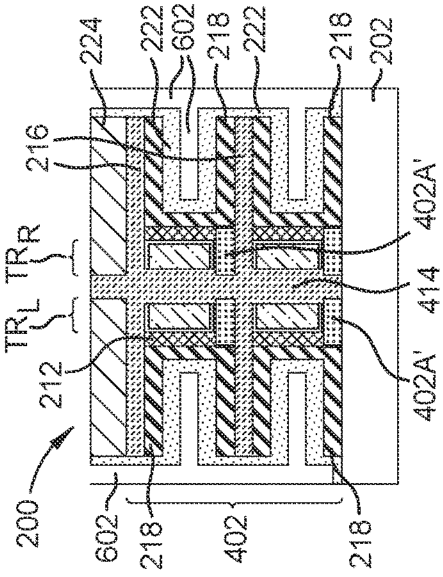

In block 522, a capacitor high-k dielectric deposition process is performed to conformally deposit high-k dielectric layers 222 on exposed surfaces of the bottom electrode layers 218 within the enlarged openings 604" and the sidewalls of the capacitor slits 602, as shown in FIG. 6K. The high-k dielectric layers 222 may be formed of high-k dielectric material, such as hafnium oxide ($HfO_2$), zirconium dioxide ($ZrO_2$), aluminum oxide ($Al_2O_3$), or any combination thereof.

The capacitor high-k dielectric deposition process in block 522 may include any appropriate deposition process, such as atomic layer deposition (ALD), chemical vapor deposition (CVD), physical vapor deposition (PVD), or the like.

Figure 6L:
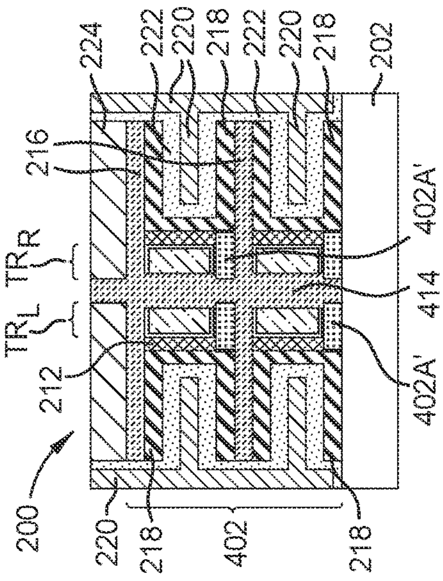

In block 524, a top electrode deposition process is performed to conformally deposit top electrode layers 220 on exposed surfaces of the high-k dielectric layers 222 within the enlarged openings 604" and within the capacitor slits 602, as shown in FIG. 6L. The top electrode layers 220 may be formed of titanium nitride (TiN).

The top electrode deposition process in block 524 may include any appropriate deposition process, such as atomic layer deposition (ALD), chemical vapor deposition (CVD), physical vapor deposition (PVD), or the like.

After the deposition process, the semiconductor structure 200 may be planarized, by use of a chemical mechanical planarization (CMP) process.

In block 526, a bit line (BL) patterning process is performed to form a BL opening 612, as shown in FIG. 6M.

The BL patterning process in block 524 may include any appropriate lithography and etch processes, such as photolithography.

In block 526, a doping process is performed to dope the portions 402A' of the thicker channel layers 402A inside of the offsets 212 with n-type dopants, such as such as phosphorous (P) or arsenide (As), from sides 614 adjacent to the BL opening 612, as shown in FIG. 6N. The doped portions 402A' of the thicker channel layers 402A act as active regions 206 shown in FIG. 2B. The sides 610 and 614 of the active regions 206 act as source/drain.

The doping process in block 526 may include gas phase doping.

In block 528, a bit line metal forming process is performed to form a barrier metal layer 616 on the inner surfaces of the BL opening 612 and a bit line metal layer 618 on exposed surfaces of the barrier metal layer 616, as shown in FIG. 6O. The bit line metal layer 618 may be formed of contact plug metal material, such as tungsten (W), cobalt (Co), ruthenium (Ru), or molybdenum (Mo). The barrier metal layer 616 may be formed of a barrier metal material that is titanium nitride (TiN), or tantalum nitride (TaN). The bit line metal layer 618 and the barrier metal layer 616 act as a bit line BL shown in FIGS. 1A and 1B.

The bit line metal forming process in block 528 may include any appropriate deposition process, such as atomic layer deposition (ALD), chemical vapor deposition (CVD), physical vapor deposition (PVD), or the like.

After the deposition process, the semiconductor structure 200 may be planarized, by use of a chemical mechanical planarization (CMP) process.

The embodiments described herein provide single gated three-dimensional (3D) dynamic random-access memory (DRAM) devices and methods for forming cell transistors and cell capacitors in single gated 3D DRAM devices within two-color stacking mold of, for example, silicon (Si) and silicon germanium (SiGe). Due to the single gated structure, word lines that are connected to the gates can be shorter than in the double gated structure, and thus height of each of vertical stacks of memory cells can be scaled down without increasing a gate resistance or a bit line capacitance. Further, in the single gated 3D DRAM devices, active regions may be epitaxially grown, and thus may not be collapsed when height of each of vertical stacks of memory cells is reduced.

While the foregoing is directed to embodiments of the present disclosure, other and further embodiments of the disclosure may be devised without departing from the basic scope thereof, and the scope thereof is determined by the claims that follow.

The invention claimed is:

1. A memory cell array, comprising:

a plurality of memory levels stacked in a first direction, each of the plurality of memory levels comprising:

a first spacer layer extending in a second direction that is orthogonal to the first direction;

a second spacer layer extending in the second direction, disposed below the first spacer layer in the first direction;

an active region disposed directly above the second spacer layer and below the first spacer layer in the first direction;

a cell transistor having a single gate disposed between the first spacer layer and the second spacer layer in the first direction; and a cell capacitor having a bottom electrode layer between the first spacer layer and the second spacer layer in the first direction, wherein the bottom electrode layer is electrically connected to the active region.

2. The memory cell array of claim 1, wherein each of the plurality of memory levels further comprises:

a word line layer extending from the single gate of the cell transistor in a second direction that is orthogonal to the first direction.

3. The memory cell array of claim 1, wherein the active region of each of the plurality of memory levels is above a spacer in the first direction and in contact with the spacer.

4. The memory cell array of claim 1, wherein the active region comprises silicon (Si) or indium gallium zinc oxide (IGZO).

5. The memory cell array of claim 1, wherein the active region is epitaxially grown.

6. The memory cell array of claim 1, further comprising:

a bit line in contact with each of the plurality of memory levels, the bit line extending in the first direction.

7. A method of forming cell transistors in a semiconductor memory device, comprising:

depositing a stacking mold comprising a plurality of unit stacks, each unit stack comprising a thicker channel layer, a thicker sacrificial layer over the thicker channel layer, a thinner channel layer over the thicker sacrificial layer, and a thinner sacrificial layer over the thinner channel layer stacked in a first direction;

forming a transistor slit through the stacking mold in the first direction;

forming first recesses in the thicker sacrificial layers and second recesses in the thinner sacrificial layers from sidewalls of the transistor slit;

partially filling the first recesses and fully filling with the second recesses with a first insulator layer from the sidewalls of the transistor slit; and removing the first insulator layer on the sidewalls of the transistor slit and within the first recesses.

8. The method of claim 7, wherein each of the thicker channel layers is thicker than each of the thinner channel layers by a factor of between 1.1 and 2, and each of the thicker sacrificial layers is thicker than each of the thinner sacrificial layers by a factor of between 1.1 and 2.

9. The method of claim 7, wherein the thicker channel layers and the thinner channel layers each comprise silicon or indium gallium zinc oxide (IGZO), and the thicker sacrificial layers and the thinner sacrificial layers each comprise silicon germanium (SiGe), silicon oxide ($SiO_2$), borophosphosilicate glass (BPSG), boron silica glass (BSG), or phosphosilicate glass (PSG).

10. The method of claim 7, wherein the first insulator layer has a thickness of between a half of a thickness of each of the thinner sacrificial layers and a half of a thickness of each of the thicker sacrificial layers.

11. The method of claim 7, further comprising:

partially removing portions of the thicker channel layers that are adjacent to the first recesses in the first direction and entirely removing the thinner channel layers that are adjacent to the first recesses in the first direction;

forming gate oxide layers on exposed portions of the thicker channel layers;

forming barrier metal layers on inner surfaces of the first recesses and word line layers on exposed surfaces of the barrier metal layers; and filling the transistor slit with a second insulator layer.

12. The method of claim 7, wherein the depositing of the stacking mold comprises epitaxial deposition process.

13. A method of forming cell capacitors in a semiconductor memory device, comprising:

depositing a stacking mold comprising a plurality of unit stacks, each unit stack comprising a thicker channel layer, a thicker sacrificial layer over the thicker channel layer, a thinner channel layer over the thicker sacrificial layer, and a thinner sacrificial layer over the thinner channel layer stacked in a first direction;

forming a transistor slit through the stacking mold in the first direction;

forming first openings in the thicker sacrificial layers and second openings in thinner sacrificial layers from sidewalls of the capacitor slits;

partially filling the first openings and fully filling the second openings with a spacer layer from the sidewalls of the capacitor slits; and removing the spacer layer on the sidewalls of the capacitor slits and within the first openings.

14. The method of claim 13, wherein each of the thicker channel layers is thicker than each of the thinner channel layers by a factor of between 1.1 and 2, and each of the thicker sacrificial layers is thicker than each of the thinner sacrificial layers by a factor of between 1.1 and 2.

15. The method of claim 13, wherein the thicker channel layers and the thinner channel layers each comprise silicon or indium gallium zinc oxide (IGZO), and the thicker sacrificial layers and the thinner sacrificial layers each comprise silicon germanium (SiGe), silicon oxide ($SiO_2$), borophosphosilicate glass (BPSG), boron silica glass (BSG), or phosphosilicate glass (PSG).

16. The method of claim 13, wherein the spacer layer has a thickness of between a half of a thickness of each of the thinner sacrificial layers and a half of a thickness of each of the thicker sacrificial layers.

17. The method of claim 13, further comprising:

performing a first channel trimming process, comprising partially removing portions of the thicker channel layers that are adjacent to the first openings in the first direction and entirely removing portions of the thinner channel layers that are adjacent to the first openings in the first direction from the first openings;

forming offsets on inner surfaces of the first openings opposite of the capacitor slits in a second direction that is orthogonal to the first direction; and removing the remaining portions of the thicker channel layers that are adjacent to the first openings in the first direction.

18. The method of claim 17, further comprising:

conformally depositing bottom electrode layers on exposed surfaces within the first openings;

conformally depositing high-k dielectric layers on exposed surfaces of the bottom electrode layers within the first openings and the sidewalls of the capacitor slits; and conformally depositing top electrode layers on exposed surfaces of the high-k dielectric layers within the first openings and within the capacitor slits.

19. The method of claim 18, further comprising:

forming a bit line opening; and forming a barrier metal layer on inner surfaces of the bit line opening and a bit line metal layer on exposed surfaces of the barrier metal layer.

20. The method of claim 19, further comprising:

subsequent to performing the first channel trimming process, doping the remaining portions of the thicker channel layers that are adjacent to the first openings in the first direction from the first openings; and subsequent to forming the bit line opening, doping the remaining portions of the thicker channel layers that are adjacent to the first openings in the first direction from the bit line opening.

* * * * *